(12) United States Patent
Yagishita et al.

(10) Patent No.: US 6,728,157 B2
(45) Date of Patent: Apr. 27, 2004

(54) SEMICONDUCTOR MEMORY (75) Inventors: Yoshimasa Yagishita, Kawasaki (JP);
Toshiya Uchida, Kawasaki (JP);
Yoshihide Bando, Kawasaki (JP);
Hiroyuki Kobayashi, Kawasaki (JP);
Shusaku Yamaguchi, Kawasaki (JP);
Masaki Okuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/335,948

(22) Filed: Jan. 3, 2003

(65) Prior Publication Data
US 2004/0004883 A1 Jan. 8, 2004

(30) Foreign Application Priority Data
Jul. 4, 2002 (JP) .......................................... 2002-196244

(51) Int. Cl.⁷ ................................................ G11C 7/00
(52) U.S. Cl. .............. 365/222; 365/230.03; 365/189.04
(58) Field of Search ............................. 365/222, 230.03, 365/233

(56) References Cited

U.S. PATENT DOCUMENTS

| 4,766,573 | A | | 8/1988 | Takemae ..................... 365/222 |
|---|---|---|---|---|
| 5,774,409 | A | * | 6/1998 | Yamazaki et al. ...... 365/230.03 |
| 6,426,909 | B1 | * | 7/2002 | Tomita ....................... 365/222 |
| 6,542,959 | B2 | * | 4/2003 | Tabo .......................... 711/106 |
| 6,597,617 | B2 | * | 7/2003 | Ooishi et al. ............... 365/222 |
| 2002/0060940 | A1 | * | 5/2002 | Tomita ....................... 365/222 |

* cited by examiner

Primary Examiner—Son Mai
(74) Attorney, Agent, or Firm—Arent Fox PLLC (57) ABSTRACT A plurality of memory blocks is allocated the same address spaces to write the same data therein, and is operable independently of one another. One of the memory blocks is selected as a refresh block that performs a refresh operation, in response to a refresh command, while another one of the memory blocks is selected as a read block that performs a read operation, in response to a read command. Then, the plurality of memory blocks performs read operations at different timings so that the read operations overlap one another. Therefore, the semiconductor memory can receive read commands at intervals each of which is shorter than the execution time of a single read operation. As a result, externally supplied read commands can be responded to at high speed, and the data transmission rate during read operation can be improved.

18 Claims, 9 Drawing Sheets

SEMICONDUCTOR MEMORY

BACKGROUND OF THE INVENTION

1. Field of the Invention

The present invention relates to dynamic RAMs that require periodic refresh operations of the memory cells thereof. More particularly, the present invention relates to a technique for internally and automatically performing the refresh operations without requiring any refresh commands from the exterior.

2. Description of the Related Art

Dynamic RAMs (hereinafter referred to as DRAMs) are suitable for a high integration because their memory cells can be formed small. The DRAMs, however, require refresh operations for retaining data stored in the memory cells. The refresh operations must be periodically performed with respect to all the memory cells. When a refresh command occurs, a refresh operation must be given priority over a read or write operation.

For example, in the system on which a DRAM is mounted, a memory controller for controlling the DRAM supplies a refresh command to the DRAM prior to a read or write command when the refresh command occurs from a refresh timer of the memory controller.

On the other hand, SRAMs, unlike DRAMs, require no refresh operations. The SRAMs, however, have such a disadvantage that their memory capacities are small as compared with DRAMs because the number of the elements constituting each memory cell of the SRAMs is large as compared with the DRAMs.

The conventional DRAMs had a drawback that the control of them was complicated as compared with the SRAMs because the memory controllers of the DRAMs had to control the refresh operations as well. The conventional DRAMs also had a drawback that their data transmission rates were low as compared with the SRAMs because the read and write operations could not be performed during the refresh operations.

On the other hand, the SRAMs had, in addition to the aforementioned difficulty of providing large capacities, a drawback that the chip costs of the SRAMs are very high as compared with the DRAMs because the memory cells of the SRAMs are large in size.

SUMMARY OF THE INVENTION

It is an object of the present invention to provide semiconductor memories having both large capacity of DRAMs and high usability of SRAMs.

It is another object of the present invention to provide semiconductor memories that respond to externally supplied requests for read operation at high speed, and that have a high data-transmission rate.

According to one of the aspects of the semiconductor memory of the present invention, a plurality of memory blocks are allocated the same address spaces so as to write the same data therein, and are operable independently of one another. A refresh generator generates a refresh command to refresh the memory cells. A refresh control unit selects one of the memory blocks as a refresh block that performs a refresh operation in response to the refresh command. A read control unit selects one of the memory blocks other than the refresh block as a read block that performs a read operation in response to a read command. When a new read command is supplied during the read operation performed by the read block, the read control unit also selects another one of the memory blocks which is in an idle state other than the refresh block as a read block that performs a read operation in response to the new read command.

The plurality of memory blocks performs the read operations at different timings so that the read operations performed overlap one another. The overlapping operations of the memory blocks allow the semiconductor memory to receive read commands at intervals each of which is shorter than the internal read cycle time required for the memory blocks to perform a single read operation. That is, read commands supplied from the exterior can be responded to at high speed. As a result, the data transmission rate during read operation can be improved. Especially, in a semiconductor memory that internally generates refresh requests for performing refresh operations, the read operations can be performed at high speed.

A refresh operation is performed only in a refresh block, and a read operation is performed only in a read block. Therefore, the read operation can be prevented from being interfered with by the refresh operation.

According to another aspect of the semiconductor memory of the present invention, the refresh control unit includes a refresh block counter that performs a count operation in response to the refresh command and outputs a refresh block signal indicative of the refresh block. The read control unit includes a read block counter that performs the count operation in response to the read command and outputs a read block signal indicative of the read block. One of the memory blocks that receives the refresh block signal starts, as the refresh block, the refresh operation in response to the refresh command. Another one of the memory blocks that receives the read block signal starts, as the read block, a read operation in response to the read command. Using the counters that operate in response to commands when selecting refresh and read blocks allows simple circuits to select memory blocks in which refresh and read operations are performed.

According to another aspect of the semiconductor memory of the present invention, the read block counter updates a counter value to differentiate the read and refresh block signals from each other when the read block signal coincides with the refresh block signal by performing the count operation. Therefore, it can be prevented that a single memory block becomes both read and refresh blocks. As a result, the read operation can be prevented from being delayed due to the refresh operation. Additionally, malfunction of the memory blocks can be prevented.

According to another aspect of the semiconductor memory of the present invention, the update direction of the read block counter is opposite to the update direction of the refresh block counter. Therefore, one of the counter values can be prevented from following the other counter value, and malfunction of the memory blocks can be prevented.

According to another aspect of the semiconductor memory of the present invention, the number of the memory blocks is one more than the maximum number of the read commands that can be supplied during an internal read cycle time necessary for the memory blocks to perform a single read operation. Therefore, even when read commands are supplied successively, there always exists one memory block that is in a standby state (idle state). Accordingly, the read operations can be prevented from being delayed due to the refresh operation, and the data transmission rate during read operation can be improved.

According to another aspect of the semiconductor memory of the present invention, a write control circuit performs, in response to a write command, a write operation to write the same data into all of the memory blocks. Therefore, the read operation responsive to a read command can be performed in any of the memory blocks. Since a read operation can be started quickly in response to a read command, the data transmission rate during read operation can be improved.

According to another aspect of the semiconductor memory of the present invention, an arbiter sequentially performs operations according to write and refresh commands in the order of accepting the commands when the commands conflict with each other in the refresh block. Therefore, malfunction of the memory blocks can be prevented.

According to another aspect of the semiconductor memory of the present invention, the arbiter receives the write command in synchronization with one of rising and falling edges of the clock signal, and receives the refresh command in synchronization with the other one of the rising and falling edges of the clock signal. Since the reception of the write command and that of the refresh command are displaced by a half clock or more, the control circuit for deciding the priority order of the commands can be easily formed.

According to another aspect of the semiconductor memory of the present invention, when receiving the write command during the refresh operation, the write control circuit starts the write operation after a completion of the refresh operation in the refresh block, and starts the write operation in synchronization with the write command in the memory blocks other than the refresh block. Performing the write operations in synchronization with the write command in the memory blocks that are in idle states allows the memory operation responsive to a command supplied thereafter to be started earlier. Especially, since the read operation responsive to a read command can be started earlier, the data transmission rate during read operation can be improved.

According to another aspect of the semiconductor memory of the present invention, the edge of a clock signal at which a command receiving circuit receives read and write commands is different from the edge of a clock signal at which the refresh generator outputs a refresh command. The read and write commands from the exterior and the internally generated refresh command are supplied to internal circuits, always being displaced by a half clock or more. Thus, the control of deciding priority order of the command can be easily performed.

According to another aspect of the semiconductor memory of the present invention, the external read cycle time that is the minimum supply interval between the read commands is set as being shorter than the external write cycle time that is the minimum supply interval between write commands. Therefore, the external read cycle time can be optimally set in accordance with the circuits that operate during the read operations, so that the data transmission rate during read operation can be improved.

According to another aspect of the semiconductor memory of the present invention, the external write cycle time that is the minimum supply interval between write commands is supplied is set as being longer than the internal write cycle time that is the actual write operation time of the memory blocks. Therefore, when a refresh request occurs, a refresh operation can be performed between write operations. For example, n write operations and one of the refresh operation can be performed during a time period of n successive external write cycles. As a result, the refresh operation can be performed without being externally recognized.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described below with reference to the drawings.

Figure 1:
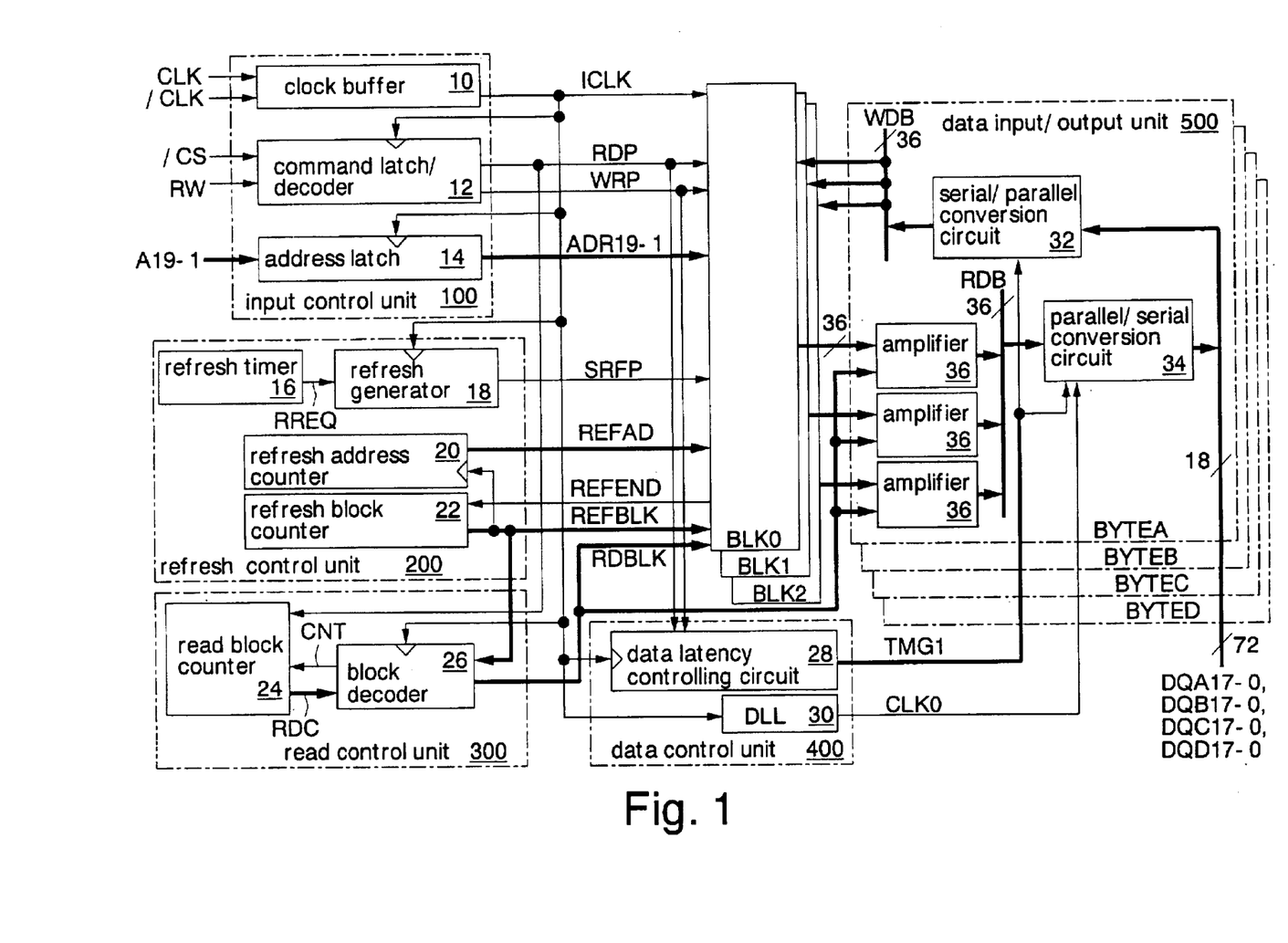
FIG. 1 is a block diagram showing a first embodiment of the present invention.

Referring to FIG. 1, there is shown a first embodiment of semiconductor memory according to the present invention. In the figure, each of the signal lines shown by thick lines is constituted by a plurality of signal lines. The signals identified by designations prefixed with "/" represent negative logics.

This semiconductor memory is formed on a silicon substrate as a clock-synchronous double-data-rate (DDR) pseudo SRAM by use of CMOS process. The DDR is an interface for inputting/outputting data in synchronization with both the rising and falling edges of clock signals. The pseudo SRAM has an input control unit 100, a refresh control unit 200, a read control unit 300, memory blocks BLK (BLK0-2), a data control unit 400, and data input/output units 500.

The pseudo SRAM also has input terminals for receiving, from the exterior, clock signals CLK and/CLK, a chip select signal/CS, a read/write signal RW, and address signals A19-1, while it also has input/output terminals (data terminals) for inputting/outputting data signals DQA17-0, DQB17-0, DQC17-0 and DQD17-0.

The input control unit 100 has a clock buffer 10, a command latch/decoder (a command receiving circuit) 12, and an address latch 14. The clock buffer 10 receives complementary clock signals CLK and /CLK via the clock terminals, and generates internal clock signals ICLK.

The command latch/decoder 12 latches chip select signals /CS and read/write signals RW in synchronization with the rising edges of internal clock signals ICLK, and decodes the latched signals, thereby producing read signals RDP and write signals WRP. More specifically, when receiving a chip select signal /CS of a low level and a read/write signal RW of a high level in synchronization with the rising edge of a clock signal CLK, the command latch/decoder 12 judges that a read command for performing a read operation has been supplied, and then the command latch/decoder 12 outputs a read signal RDP. When receiving a chip select signal /CS of a low level and a read/write signal RW of a low level in synchronization with the rising edge of a clock signal CLK, the command latch/decoder 12 judges that a write command for performing a write operation has been supplied, and then the command latch/decoder 12 outputs a write signal WRP.

The address latch 14 receives address signals A19-1 in synchronization with the rising edges of internal clock signals ICLK, and outputs the received signals as internal address signals ADR19-1.

The refresh control unit 200 has a refresh timer 16, a refresh generator 18, a refresh address counter 20, and a refresh block counter 22. The refresh timer 16 outputs a refresh request signal RREQ at predetermined intervals. The refresh generator 18 receives the refresh request signal RREQ, and outputs the received signal, as a refresh signal SRFP (a refresh command), in synchronization with the falling edge of an internal clock signal ICLK.

The refresh address counter 20 performs count actions in synchronization with changes of the logic value of the highest-order bit of a plural-bit refresh block signal REFBLK outputted from the refresh block counter 22, and generates refresh address signals REFAD. That is, the refresh address counter 20 performs a count action each cycle of the refresh block signal REFBLK, and generates refresh address signals REFAD.

The refresh block counter 22 performs count actions in synchronization with refresh end signals REFEND outputted from the memory blocks BLK0-2, and generates refresh block signals REFBLK indicative of a memory block BLK in which to perform a refresh operation. More particularly, the refresh block counter 22 counts up and sequentially outputs, as the refresh block signals REFBLK, logics "0", "1", "2", "0", "1", "2", . . . The logic value of a refresh block signal REFBLK indicates the number of a memory block BLK in which to perform a refresh operation. The memory block BLK corresponding to a refresh block signal REFBLK operates, in response to a refresh command SRFP, as a refresh block in which to perform the refresh operation. In the refresh block, refresh and write operations are performed, but no read operation is performed.

The read control unit 300 has a read block counter 24 and a block decoder 26. The read block counter 24 performs a count action in synchronization with the rising edge of a read signal RDP or the rising edge of a counter signal CNT from the block decoder 26, and generates a read counter signal RDC indicative of a memory block BLK in which to perform a read operation. More particularly, the read block counter 24 counts down and sequentially outputs, as read counter signals RDC, logics "2", "1", "0", "2", "1", "0", . . . .

The block decoder 26 receives a read counter signal RDC in synchronization with a signal that is a delayed version of the rising edge of an internal clock signal ICLK, and outputs the received signal as a read block signal RDBLK (one of logics "2", "1" and "0"). Like the logic value of the read counter signal RDC, the logic value of the read block signal RDBLK indicates the number of the memory block BLK in which to perform the read operation. That is, the memory block BLK corresponding to a read block signal RDBLK operates, in response to a read command, as a read block in which to perform the read operation. In the read block, read and write operations are performed, but no refresh operation is performed.

Ensuring that the direction of updating the logic value of the read block signal RDBLK is opposite to that of updating the logic value of the refresh block signal REFBLK as described above can prevent, for example, the read block signal RDBLK from following the refresh block signal REFBLK after the logic value of the refresh block signal REFBLK is updated. Therefore, the refresh and read blocks can be prevented from successively overlapping each other, so that the pseudo SRAM can be prevented from providing a malfunction.

When the block decoder 26 receives a read counter signal RDC having the same logic value as the refresh block signal REFBLK, it outputs a counter signal CNT. The counter signal CNT causes the read block counter 24 to count down, so that the read block signal RDBLK can be prevented from coinciding with the refresh block signal REFBLK. In other words, the refresh block in which to perform a refresh operation and the read block in which to perform a read operation will not coincide with each other.

The memory blocks BLK0-2 are allocated the same address spaces and have the same memory capacities as one another. The memory blocks BLK0-2 each have a plurality of memory cores each having DRAM memory cells. The memory blocks BLK0-2, each receiving internal clock signals ICLK, a read signal RDP, a write signal WRP, a refresh signal SRFP, a refresh address signal REFAD, a refresh block signal REFBLK, and a read block signal RDBLK, operate independently of one another to perform one of read, write and refresh operations. During write operation, the memory blocks BLK0-2 each receive write data via a respective write data bus line WDB. At this moment, the write data are written into all of the memory blocks BLK0-2. During read operation, the memory blocks BLK0-2 output read data to respective read data bus lines RDB via respective amplifiers 36.

The data control unit 400 has a data latency controlling circuit 28 and a DLL circuit 30. The data latency controlling circuit 28 receives a read signal RDP and a write signal WRP from the command latch/decoder 12 and also receives internal clock signals ICLK, and outputs timing signals TMG1 to the data input/output units 500. The DLL circuit 30 adjusts the phase of the internal clock signals ICLK and generates phase-adjusted clock signals CLK0 having the same phase as the clock signals CLK.

There are formed four data input/output units 500 associated with respective data groups BYTEA, BYTEB, BYTEC and BYTED, which deal with 18-bit data signals DQA17-0, DQB17-0, DQC17-0 and DQD17-0 as their respective input/output signals. The data input/output units 500 each have a serial/parallel conversion circuit 32, a parallel/serial conversion circuit 34, and the amplifiers 36 associated with the respective memory blocks BLK0-2.

The serial/parallel conversion circuit 32 converts 18-bit write data sequentially supplied via the data terminals into parallel data in synchronization with a timing signal TMG1, and outputs those parallel data to the write data bus lines WDB. The parallel/serial conversion circuit 34 converts 36-bit read data on the read data bus lines RDB into serial data in synchronization with a timing signal TMG1, and outputs those serial data to the data terminals in synchronization with phase-adjusted clock signals CLK0. The amplifiers 36 amplify the data read from the memory blocks BLK0-2, and output the amplified data to the read data bus lines RDB.

Figure 2:
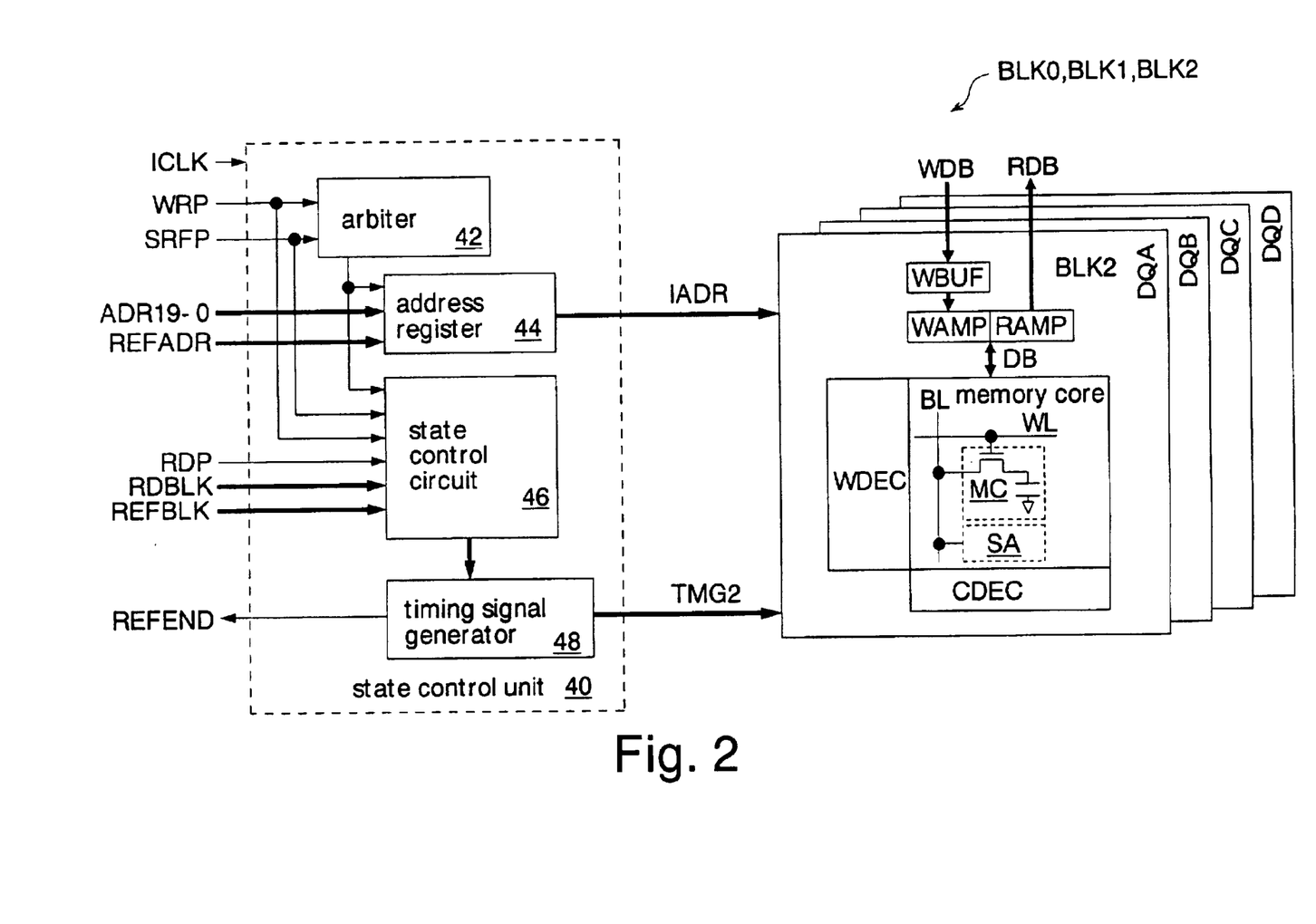
FIG. 2 is a block diagram showing the details of the memory blocks shown in FIG. 1.

FIG. 2 shows the details of the memory blocks BLK0-2 shown in FIG. 1.

Each of the memory blocks BLK0-2 has a state control unit 40 and memory units DQA, DQB, DQC and DQD associated with the data groups BYTEA, BYTEB, BYTEC and BYTED, respectively. The state control unit 40 has an arbiter 42, an address register 44, a state control circuit (a write control circuit) 46 and a timing signal generator 48.

The arbiter 42 decides which to give a priority, a write signal WRP generated in response to an external write command or a refresh signal SRFP generated in response to a refresh request internally and periodically generated, and outputs the decision result to the address register 44 and state control circuit 46. The command latch/decoder 12 shown in FIG. 1 outputs write signals WRP in synchronization with the rising edges of clock signals CLK. The refresh generator 18 outputs refresh signals SRFP in synchronization with the falling edges of clock signals CLK. Therefore, the arbiter 42 receives the write signals WRP in synchronization with the rising edges of the clock signals CLK, and receives the refresh signals SRFP in synchronization with the falling edges of the clock signals CLK. Since the supply of the write signals WRP and that of the refresh signals SRFP are always displaced with respect to each other by a half clock or more, a simple circuit can be used to constitute the arbiter 42 that can reliably decide the priority order.

The address register 44 outputs, on the basis of an output of the arbiter 42, either the internal address signals ADR19-1 or the refresh address signals REFAD as internal address signals IADR.

While the state control circuit 46 is receiving the corresponding read block signal RDBLK or refresh block signal REFBLK, it can receive a read signal RDP or refresh signal SRFP, respectively. For example, while the state control circuit 46 of the memory block BLK0 is receiving a read block signal RDBLK indicative of logic "0", it outputs, in response to a read signal RDP, to the timing signal generator 48 a control signal for performing a read operation. At this moment, the state control circuits 46 of the memory blocks BLK1-2, even when receiving the read signal RDP, do not operate. Similarly, while the state control circuit 46 of the memory block BLK0 is receiving a refresh block signal REFBLK indicative of logic "0", it outputs, in response to a refresh signal SRFP, to the timing signal generator 48 a control signal for performing a refresh operation. At this moment, the state control circuits 46 of the memory blocks BLK1-2, even when receiving the refresh signal SRFP, do not operate.

The state control circuit 46 outputs, in response to a write signal WRP, to the timing signal generator 48 a control signal for performing a write operation. It should be appreciated that when the memory block BLK receiving a write signal WRP is a refresh block, the execution order of the write and refresh operations is decided by the arbiter 42.

It should be appreciated that because of the operation of the read control unit 300 described above, a read block signal RDBLK and a refresh block signal REFBLK that have the same logics are not outputted. Therefore, the memory block BLK receiving a read block signal RDBLK operates as a read block for performing a read or write operation, and the memory block BLK receiving a refresh block signal REFBLK operates as a refresh block for performing a refresh or write operation.

The timing signal generator 48 outputs, in accordance with a control signal from the state control circuit 46, to the memory units DQA, DQB, DQC and DQD a timing signal TMG2 for performing one of the read, write and refresh operations. The timing signal generator 48 also outputs a refresh end signal REFEND a predetermined time period after a completion of the refresh operation.

Each of the memory units DQA, DQB, DQC and DQD has a write buffer WBUF, a write amplifier WAMP, a read amplifier RAMP, a memory core M, a word decoder WDEC and a column decoder CDEC. The write buffer WBUF transfers write data on the write data bus lines WDB to the write amplifier WAMP, which outputs the write data to the memory core M via data bus lines DB. The read amplifier RAMP amplifies read data from the memory core M, and outputs the amplified read data to read data bus lines RDB.

The memory core M has a plurality of volatile memory cells MC (dynamic memory cells) arranged in a matrix, a plurality of word lines WL connected to the memory cells MC, a plurality of bit lines BL also connected to the memory cells MC, and a plurality of sense amplifiers SA connected to the bit lines BL. Each of the memory cells MC, like the ones of a typical DRAM, has a capacitor for holding data as a charge and also has a transfer transistor disposed between the capacitor and an associated one of the bit lines BL. The transfer transistor has its gate connected to an associated one of the word lines WL. Selecting word lines WL performs one of the read, write and refresh operations. The memory core M, after performing one of the read, write and refresh operations, performs a precharge operation for resetting the bit lines BL to a predetermined voltage. The precharge operation is automatically performed without receiving any external commands.

Figure 3:
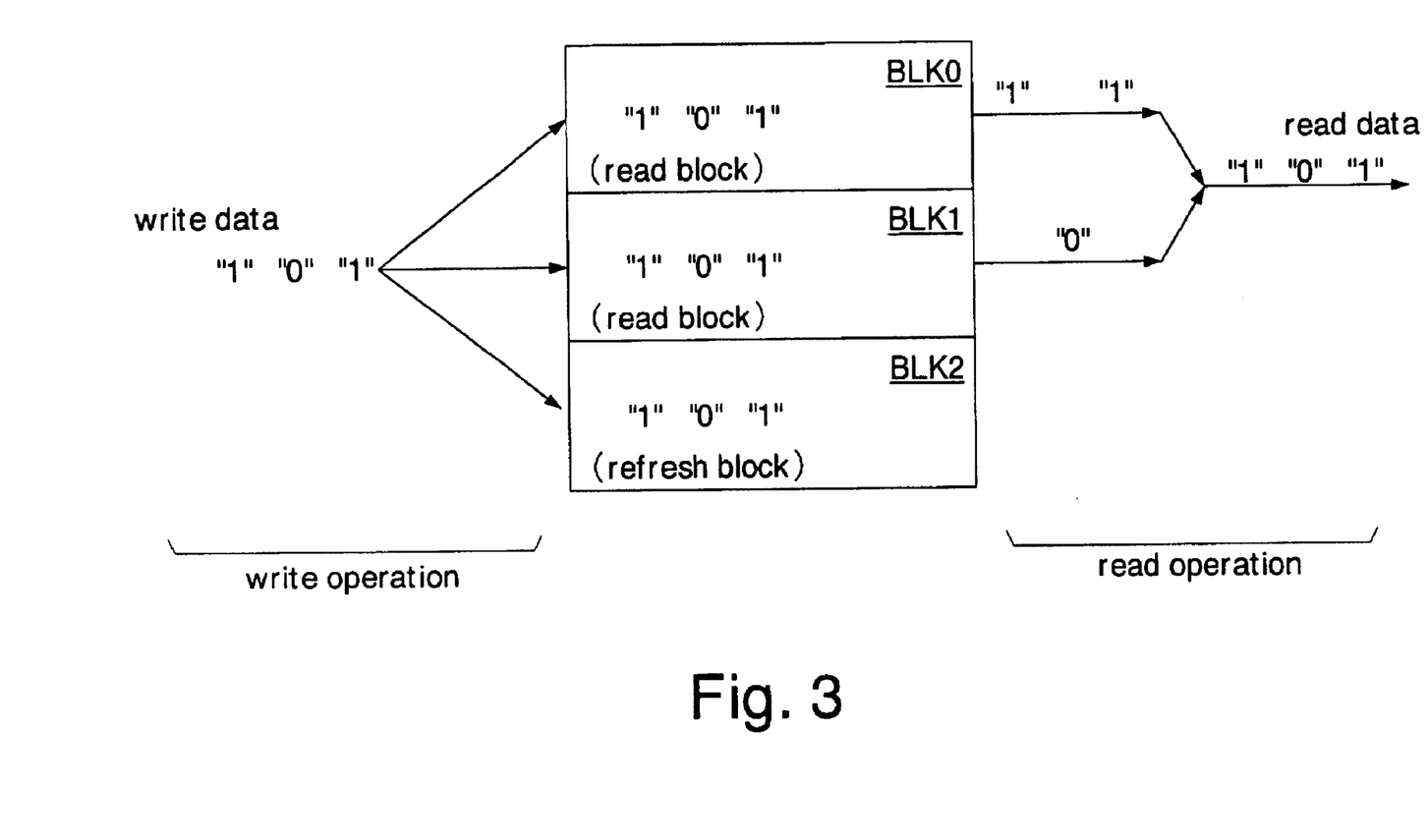
FIG. 3 is an explanatory diagram showing a summary of the operations of the first embodiment.

FIG. 3 illustrates a summary of the operations of the pseudo SRAM.

The memory block corresponding to a refresh block signal REFBLK outputted by the refresh block counter 22 shown in FIG. 1 (illustratively, BLK2) operates as a refresh block for performing write and refresh operations. The memory blocks other than the refresh block (illustratively, BLK0-1) alternately operate as read blocks for performing write and read operations each time a read command is supplied.

In write operations, write data supplied together with a write command are written into all of the memory blocks BLK0-2. Writing the same data into all of the memory blocks BLK0-2 allows read operations to be performed by using any of the memory blocks BLK0-2 any time.

In read operations, the memory blocks BLK0-1 alternately operate as read blocks in response to read commands, and output read data. Causing the memory blocks BLK0-1 to perform such overlapping operations can shorten the random read cycle time tRC (EXT) that is a supply interval between read commands (a timing specification). As a result, the data transmission rate of read data can be improved.

Figure 4:
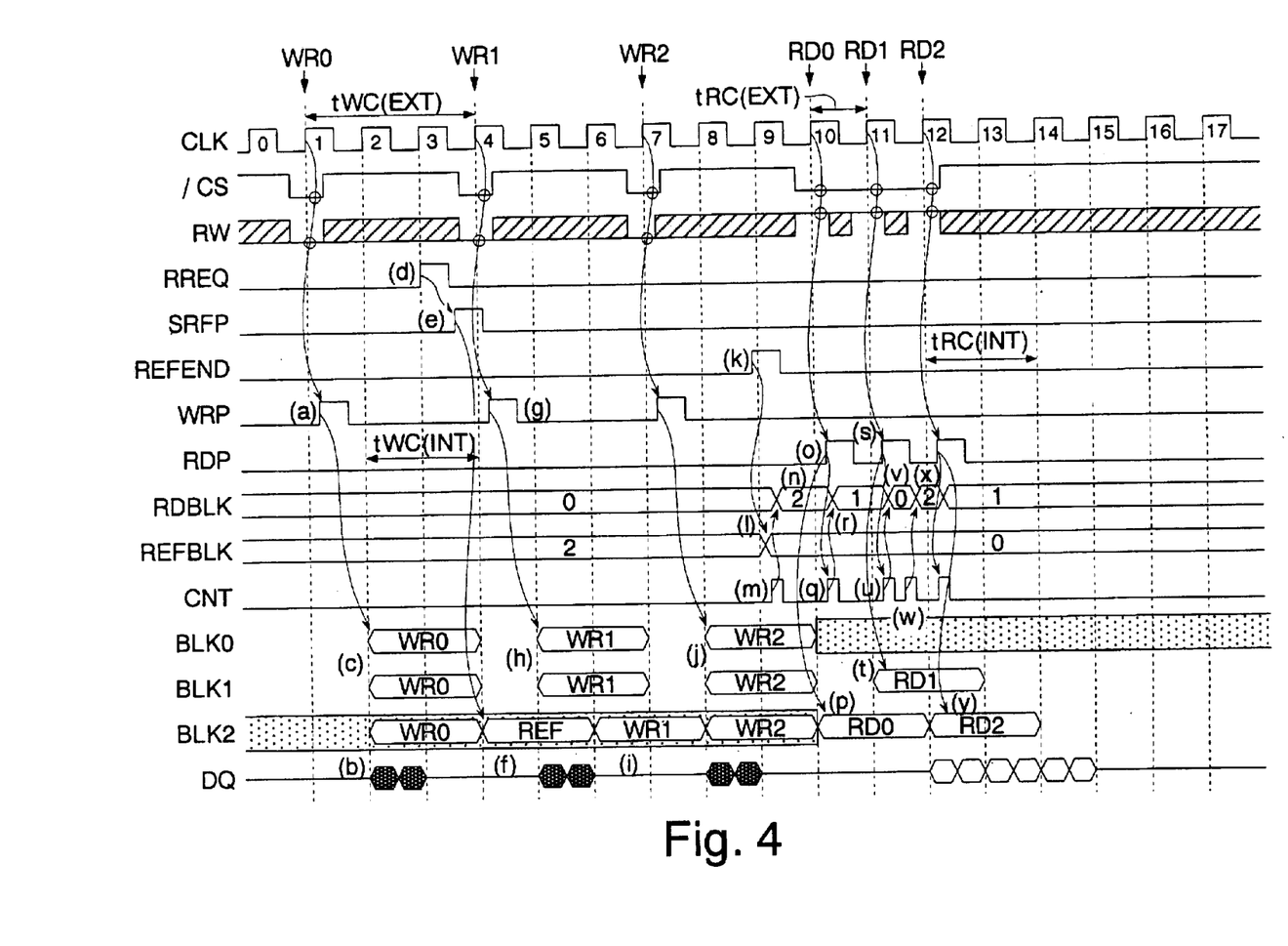
FIG. 4 is a timing diagram showing an example of the operations of the first embodiment.

FIG. 4 shows an example of the operations of the first embodiment. In this figure, memory blocks BLK shown by half-tone dot meshing are refresh blocks.

In this pseudo SRAM, the external write cycle time tWC (EXT) that is a supply interval between write commands WR (the random write cycle time) is set as 3-clock cycle, while the internal write cycle tWC time (INT) that is a write operation time of the memory blocks BLK is set as 2-clock cycle. The external read cycle time tRC (EXT) that is a supply interval between read commands RD is set as 1-clock cycle, while the internal read cycle time tRC (INT) that is a read operation time of the memory blocks BLK is set as 2-clock cycle. The operation time of the memory blocks BLK necessary for a refresh operation is set as 2-clock cycle like the read operation.

Firstly, a write command WR0 is supplied in synchronization with the first clock signal CLK, and the command latch/decoder 12 shown in FIG. 1 outputs a write signal WRP (FIG. 4(a)). Write data (shown in black in the figure) are supplied in synchronization with the rising and falling edges of the second clock signal CLK (FIG. 4(b)). The series write data are converted into parallel data by the serial/parallel conversion circuit 32. The memory blocks BLK0-2 each are in an idle state. Therefore, the memory blocks BLK0-2 each start a write operation WR0 one clock after the supply of the write command WR0 (FIG. 4(c)).

Starting the write operation one clock after the supply of the write command WR (WR0, WR1, and WR2) facilitates the control of the operation in a case where a write command WR is supplied immediately after the reception of data or immediately after a read operation. Therefore, the timing margin of the circuits can be improved, and the clock frequency can be raised. As a result, the data transmission rate can be improved.

During the write operation WR0, the refresh timer 16 outputs a refresh request signal RREQ (FIG. 4(d)). The refresh generator 18 outputs, in response to the refresh request signal RREQ, a refresh signal SRFP in synchronization with the falling edge of a clock signal CLK (FIG. 4(e)). The state control circuit 46 of the memory block BLK2 operating as the refresh block latches the refresh signal SRFP and holds this refresh signal SRFP until receiving a permission from the arbiter 42. It should be appreciated that the state control circuits 46 of the memory blocks BLK0-1 that are not refresh blocks do not receive the refresh signal SRFP.

The arbiter 42 shown in FIG. 2 outputs, in accordance with a completion of the write operation WR0, to the address register 44 and state control circuit 46 a control signal for permitting a refresh operation REF. The address register 44 outputs refresh address signals REFAD as internal address signals IADR. The state control circuit 46 of the memory block BLK2 receives the control signal from the arbiter 42 and outputs to the timing signal generator 48 a control signal for performing the refresh operation REF. Then, the memory block BLK2 performs the refresh operation REF following the write operation WR0 (FIG. 4(f)).

Next, a write command WR1 is supplied in synchronization with the fourth clock signal CLK, and a write signal WRP is outputted (FIG. 4(g)). Since the memory blocks BLK0-1 are in the idle states, they each start a write operation WR1 one clock after the supply of the write command WR1 (FIG. 4(h)). Since the memory block BLK2 is performing the refresh operation REF, the state control circuit 46 of the memory block BLK2 latches the write signal WRP and holds it until receiving a permission from the arbiter 42. Then, the memory block BLK2 performs the write operation WR1 after a completion of the refresh operation REF (FIG. 4(i)).

Thus, according to the present invention, the refresh operation REF is performed between write operations without being recognized from the exterior to the pseudo SRAM. In a case where a series of write commands WR are supplied, write operations of the memory block BLK that performs a refresh operation REF are temporarily delayed. However, since the external write cycle time tWC (EXT) is longer than the internal write cycle time tWC (INT) by one clock cycle, the delay of the write operations can be compensated for. In other words, according to the present embodiment, an execution of two write operations and one refresh operation during a time period of two external write cycle times tWC (EXT) (six clock cycles) allows the refresh operation to be concealed from the exterior.

Next, a write command WR2 is supplied in synchronization with the seventh clock signal CLK. Since the memory blocks BLK0-2 are in the idle states, they each start a write operation WR2 one clock after the supply of the write command WR2 (FIG. 4(j)).

A refresh end signal REFEND is outputted a predetermined time after the completion of the refresh operation REF (FIG. 4(k)). The timing signal generator 48 outputs the refresh end signal REFEND after the delay of the write operations (illustratively, WR1 and WR2 of the memory block BLK2) due to the refresh operation REF is compensated for.

The refresh block counter 22 updates the logic value of the refresh block signal REFBLK in response to the refresh end signal REFEND. That is, the logic value of the refresh block signal REFBLK changes from "2" to "0" (FIG. 4(l)). Then, the memory block BLK0 becomes a refresh block in synchronization with the rising edge of the next clock signal CLK after the change of the logic value of the refresh block signal REFBLK. Therefore, when the next refresh request signal RREQ occurs, the refresh operation of the memory block BLK0 is performed. Changing refresh blocks after the completion of a refresh operation REF can prevent a read operation from being performed in the memory block BLK in which the next refresh operation is performed.

The refresh block signal REFBLK coincides with the read block signal RDBLK, so that the block decoder 26 outputs a counter signal CNT (FIG. 4(m)). The read block counter 24 updates its counter by "−1" in synchronization with the counter signal CNT, and outputs the counter value as a read counter signal RDC. The block decoder 26 outputs the read counter signal RDC as the read block signal RDBLK (FIG. 4(n)). The operation of the read control unit 300 prevents the refresh block that performs a refresh operation from coinciding with the read block that performs a read operation.

Next, a read command RD0 is supplied in synchronization with the tenth clock signal CLK, and a read signal RDP is outputted (FIG. 4(o)). The state control circuit 46 of the memory block BLK2 operating as a read block outputs, in response to the read signal RDP, to the timing signal generator 48 a control signal for performing a read operation. Then, the memory block BLK2 performs the read operation RD0 following the write operation WR2 (FIG. 4(p)). The present embodiment employs such a timing specification that a read command RD is supplied three clock cycles after the supply of a write command WR, so that the memory blocks BLK, when receiving the read command RD, are always in standby states (idle states). Therefore, the read operation always can be performed in synchronization with the read command RD.

It should be appreciated that the state control circuits 46 of the memory blocks BLK0-1 that are not read blocks do not receive the read signal RDP. The block decoder 26 outputs a counter signal CNT in synchronization with the read signal RDP (FIG. 4(q)). Then, the read block signal RDBLK changes from "2" to "1" (FIG. 4(r)).

A read command RD1 is supplied in synchronization with the eleventh clock signal CLK occurring one clock after the supply of the read command RD0, and a read signal RDP is outputted (FIG. 4(s)). When the read signal RDP is outputted, the read block signal RDBLK is indicative of "1". Therefore, the memory block BLK1 operates as a read block and performs a read operation RD1 (FIG. 4(t)).

Thus, ensuring that the same data are written in all of the memory blocks BLK0-2 and that two memory blocks BLK1-2 other than the refresh block are used to alternately perform the read operations (an interleave read operation) allows the external read cycle time tRC (EX) to be half of the internal read cycle time tRC (INT). As a result, the data transmission rate during read operation can be improved. When a refresh request occurs, the refresh block that performs no read operation is used to perform a refresh operation. Therefore, the refresh operation can be prevented from affecting the read operations. That is, the refresh operation does not affect the access time.

An counter signal CNT is outputted in synchronization with the read signal RDP (FIG. 4(u)), and the read block signal RDBLK changes from "1" to "0" (FIG. 4(v)). Furthermore, since the read block signal RDBLK coincides with the refresh block signal REFBLK, another counter signal CNT is outputted (FIG. 4(w)), so that the read block signal RDBLK changes from "0" to "2" (FIG. 4(x)).

Thereafter, a read command RD2 is supplied in synchronization with the twelfth clock signal CLK, and a read operation RD2 is performed by the memory block BLK2 indicated by the read block signal RDBLK (FIG. 4(y)). It should be appreciated that read data are sequentially outputted in synchronization with the rising and falling edges of the clock signals CLK occurring two clocks later than the supplies of the respective read commands RD (the read latency is equal to two.)

Figure 5:
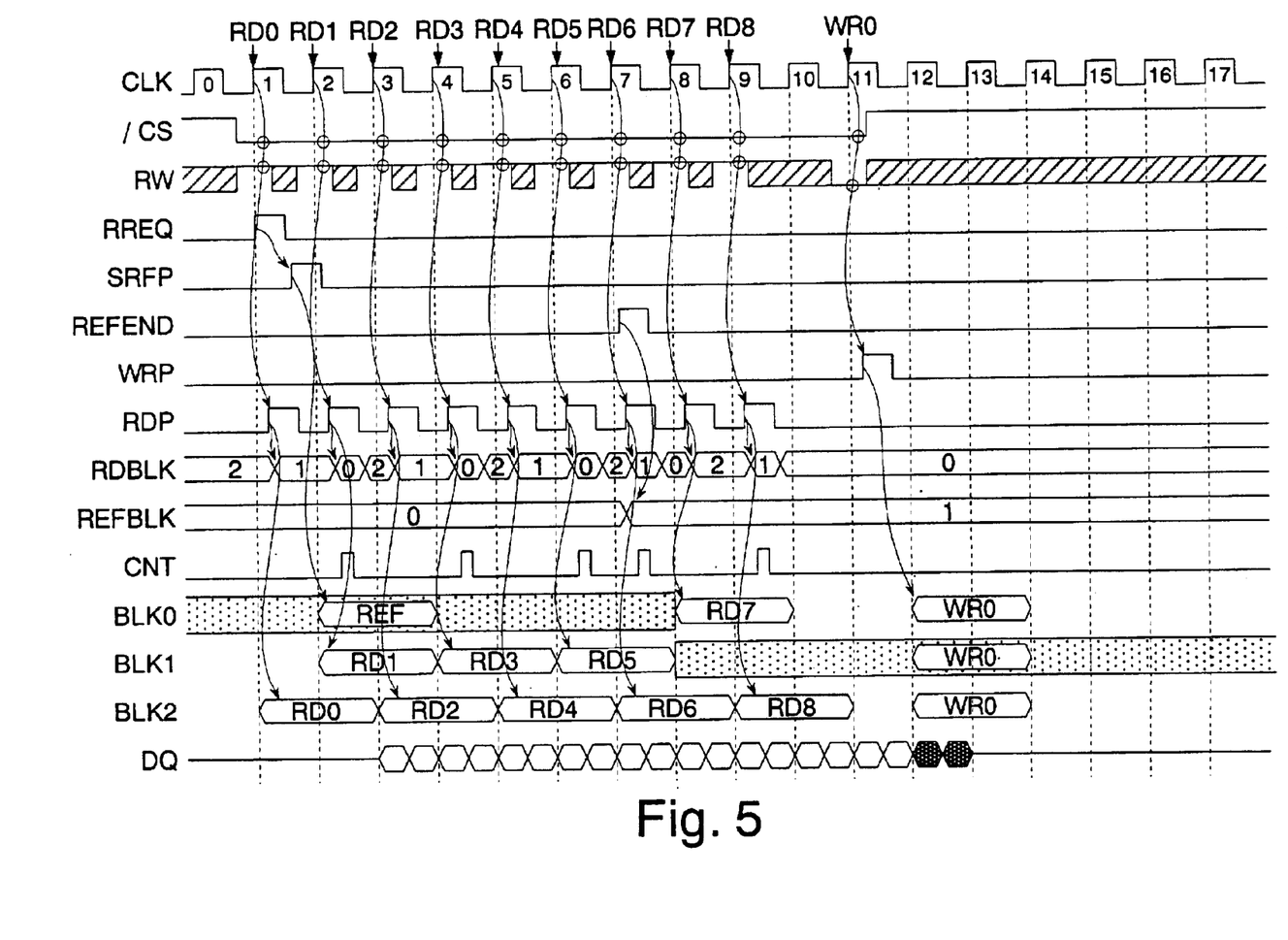
FIG. 5 is a timing diagram showing another example of the operations of the first embodiment.

FIG. 5 shows another example of the operations of the first embodiment. In this example, after nine read commands RD are successively supplied, a write command WR0 is supplied. Detailed descriptions of operations corresponding to the same operations of FIG. 4 are omitted.

Firstly, the read commands RD0-8 are sequentially supplied in synchronization with the respective first through ninth clock signals CLK. Since the refresh block is the memory block BLK0 at the beginning of the timing diagram, read operations RD0-6 are sequentially performed by using the memory blocks BLK1-2.

A refresh signal SRFP is outputted in synchronization with the falling edge of the first clock signal CLK, and a refresh operation REF of the memory block BLK0 is performed. The read block signal RDBLK is updated when a read signal RDP is outputted and when the read block signal RDBLK coincides with the refresh block signal REFBLK.

A refresh end signal REFEND is outputted in synchronization with the seventh clock signal CLK, and the refresh block signal REFBLK is updated, so that the refresh block is changed from the memory block BLK0 to the memory block BLK1. Therefore, the read operations RD7-8 corresponding to the read commands RD7-8 are performed by using the memory blocks BLK0 and BLK2, respectively.

Next, the write command WR0 is supplied in synchronization with the eleventh clock signal CLK. At this moment, since the memory blocks BLK0-2 are in the idle states, they each start a write operation WR0 one clock after the supply of the write command WR0.

In the present embodiment described above, the refresh block signal REFBLK generated by the refresh block counter 22 and the read block signal RDBLK generated by the read block counter 24 were used to select a refresh block for performing a refresh operation and a read block for performing a read operation. Therefore, the read operation can be performed without being affected by the refresh operation. Besides, sequentially switching, in synchronization with read commands RD, the read blocks that could perform read operations allowed the plurality of memory blocks BLK to perform the read operations at different timings in the manner that the performed read operations overlapped one another. Therefore, the external read cycle time tRC (EXT) can be set as being shorter than the internal read cycle time tRC (INT), so that the data transmission rate during read operation can be improved. Especially, in a pseudo SRAM that internally generates refresh requests for performing refresh operations, the read operation can be performed at high speed.

The refresh and read blocks were selected by utilizing the refresh block counter 22 and read block counter 24 that operated in response to the commands. Therefore, simple circuits can be used to select the memory blocks BLK for performing the refresh and read operations.

There were formed the memory blocks BLK the number of which was one more than the number of two read commands that could be supplied during the internal read cycle time tRC (INT). Therefore, even when read commands RD are successively supplied, refresh operations can be performed, without affecting the read operations, by using memory blocks that are in standby states. Therefore, the data transmission rate during read operation can be improved.

The same data were written into all of the memory blocks BLK in response to a write command WR. Therefore, the read operations responsive to read commands RD can be performed by using any of the memory blocks BLK. Since the read operations can be started quickly in response to the read commands RD, the data transmission rate during read operation can be improved.

There were formed the arbiters 42 for deciding the priority order when there occurred a conflict between write and refresh commands. Therefore, the memory blocks BLK can be prevented from providing malfunction. The arbiters 42 received a write signal WRP in synchronization with the rising edge of a clock signal CLK and received a refresh signal SRFP in synchronization with the falling edge of a clock signal CLK. Since the reception of a write command supplied from the exterior and that of a refresh command generated internally are necessarily displaced from each other by a half clock or more, the decision of the command priority order can be easily controlled.

When a write command WR was received during the execution of a refresh operation REF, a write operation WR was caused to start after a completion of the refresh operation REF with respect to the refresh block, and write operations WR were caused to start in synchronization with the write command WR with respect to the memory blocks BLK other than the refresh block. Performing the write operations in synchronization with the write command WR with respect to the memory blocks BLK that are in the idle states allows a memory operation responsive to the next supplied command to start earlier. Especially, causing the read operations RD responsive to read commands RD to start earlier can improve the data transmission rate during read operation.

The external read cycle time tRC (EXT) was set as being shorter than the external write cycle time tWC (EXT). Therefore, the external read cycle time tRC (EXT) can be optimally set in accordance with the circuits that operate during the read operations, so that the data transmission rate during read operation can be improved.

The external write cycle time tWC (EXT) was set as being longer than the internal write cycle time tWC (INT). Therefore, when a refresh request signal RREQ occurs, a refresh operation REF can be performed between write operations WR. As a result, the refresh operation can be performed without being externally recognized.

Figure 6:
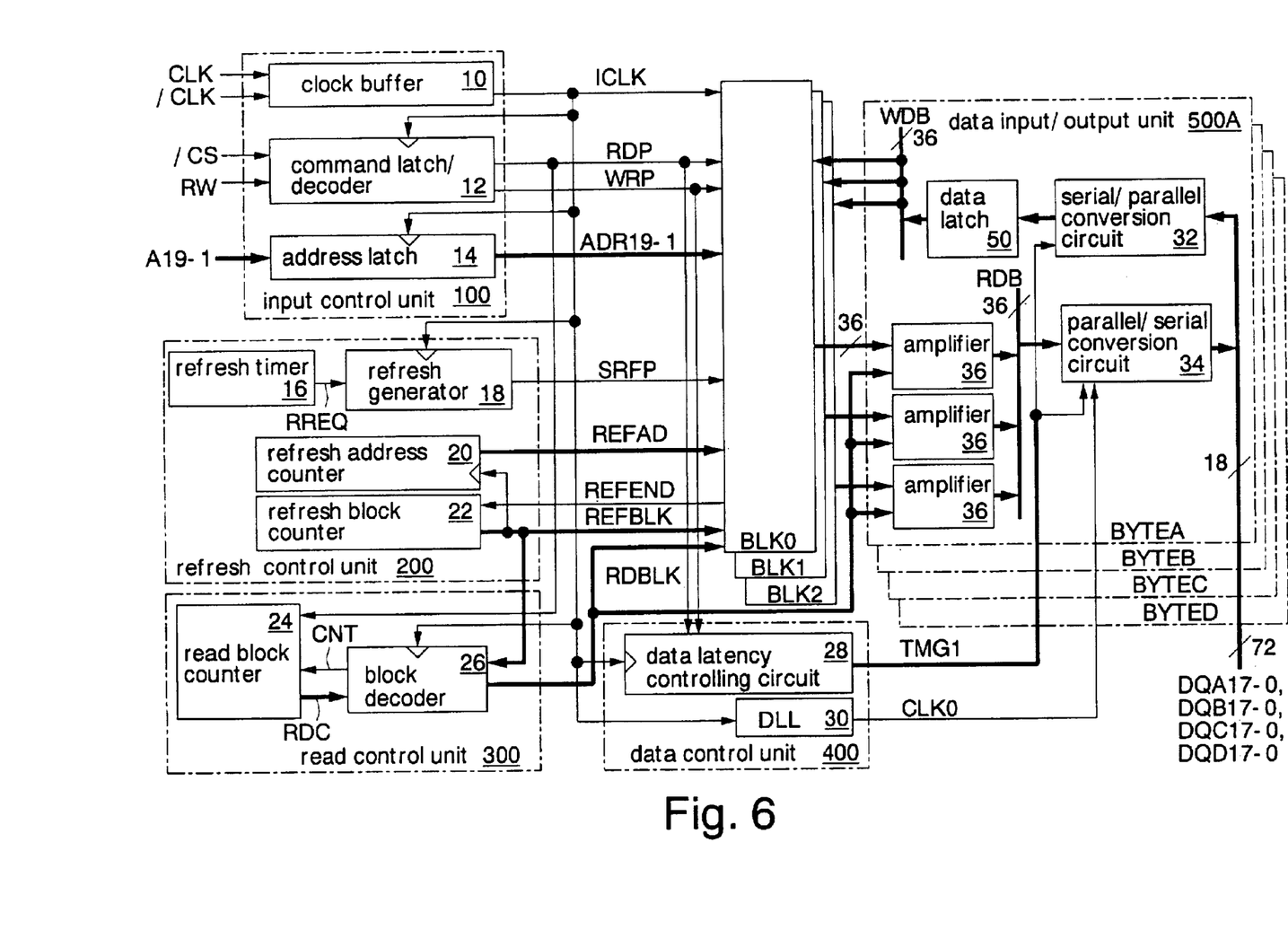
FIG. 6 is a block diagram showing a second embodiment of the present invention.

FIG. 6 shows a second embodiment of semiconductor memory according to the present invention. In this embodiment, circuits and signals corresponding to the same circuits and signals in the first embodiment are identified by the same reference designations, and their detailed descriptions are omitted.

In order to improve the utilization efficiency of data buses, the pseudo SRAM of the present embodiment has a function, called "delayed write" or "late write", to write data supplied in response to a write command into the memory cells when the next write command is supplied.

In order to realize the "delayed write" function, the pseudo SRAM includes a data input/output unit 500A formed in place of the data input/output unit 500 of the first embodiment. The circuit arrangements of the present embodiment other than the data input/output unit 500A are the same as those of the first embodiment.

In the data input/output unit 500A, write data outputted from the serial/parallel conversion circuit 32 are transferred to the write data bus lines WDB via a data latch 50. The data latch 50 temporarily holds the write data supplied in response to a write command, and outputs the held write data to the write data bus lines WDB in response to a supply of the next write command.

Figure 7:
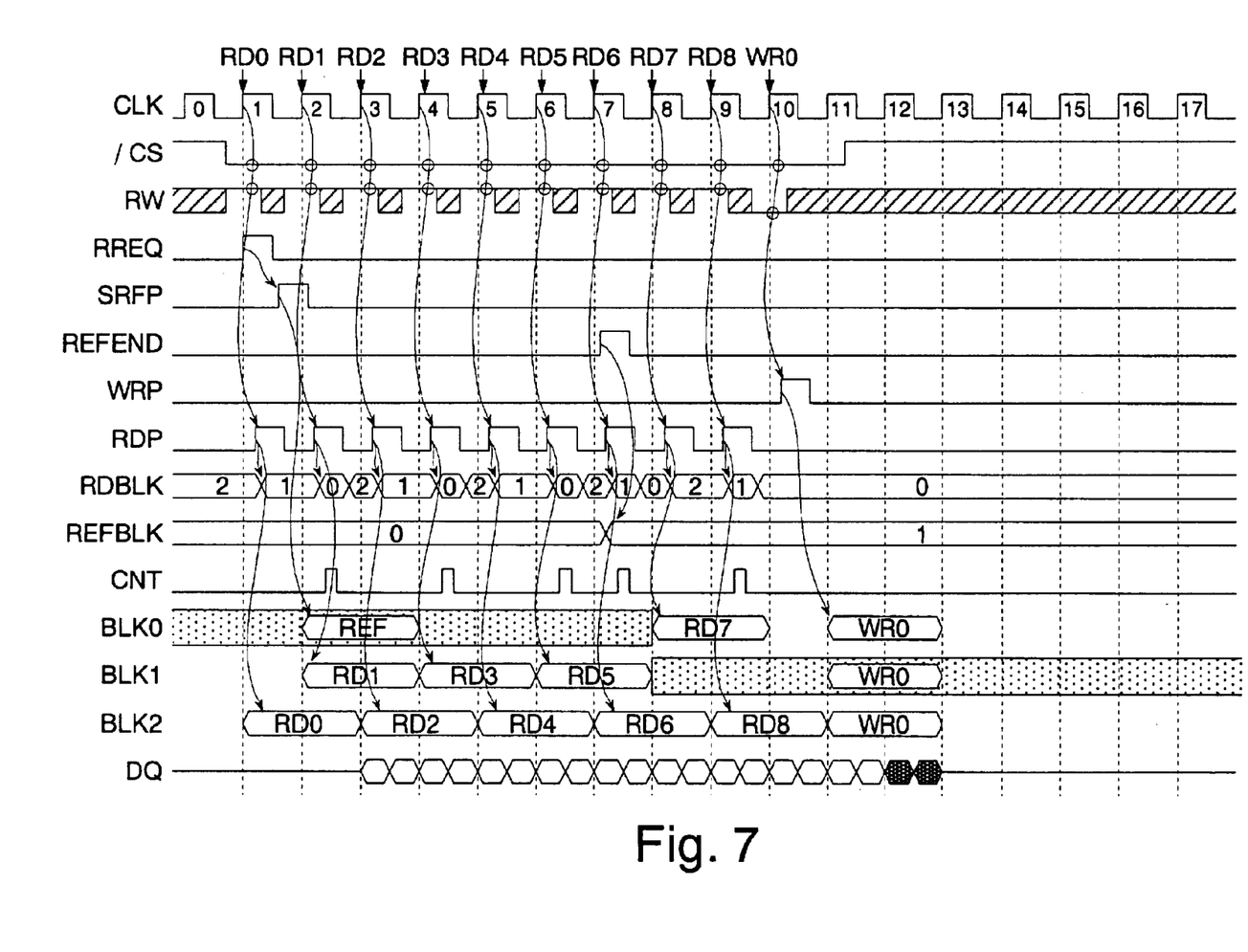
FIG. 7 is a timing diagram showing an example of the operations of the second embodiment.

FIG. 7 shows an example of the operations of the second embodiment. The operations corresponding to read commands RD0-8 in the present embodiment are the same as those in the first embodiment (FIG. 5), and hence their descriptions are omitted.

Because having the "delayed write" function, the pseudo SRAM can receive a write command WR0 at the clock cycle occurring immediately after receiving the read command RD8. The write data (shown in black in FIG. 7) corresponding to the write command WR0 are sequentially supplied in synchronization with the rising and falling edges of the twelfth clock signal CLK after write operations WR0 are started (the write latency is equal to "2").

In the write operations WR0, the write data supplied in response to the previous write command (not shown) and held in the data latch 50 shown in FIG. 6 are written (a delayed write operation). The write data supplied in synchronization with the twelfth clock signal CLK are temporarily held in the data latch and are written by the write operations responsive to the next write command.

The present embodiment can provide similar effects to those of the foregoing first embodiment. Additionally, according to the present embodiment, since the "delayed write" function has been imparted to the pseudo SRAM, a write command can be supplied immediately after the supply of a read command, so that the bus occupancy of data can be improved.

Figure 8:
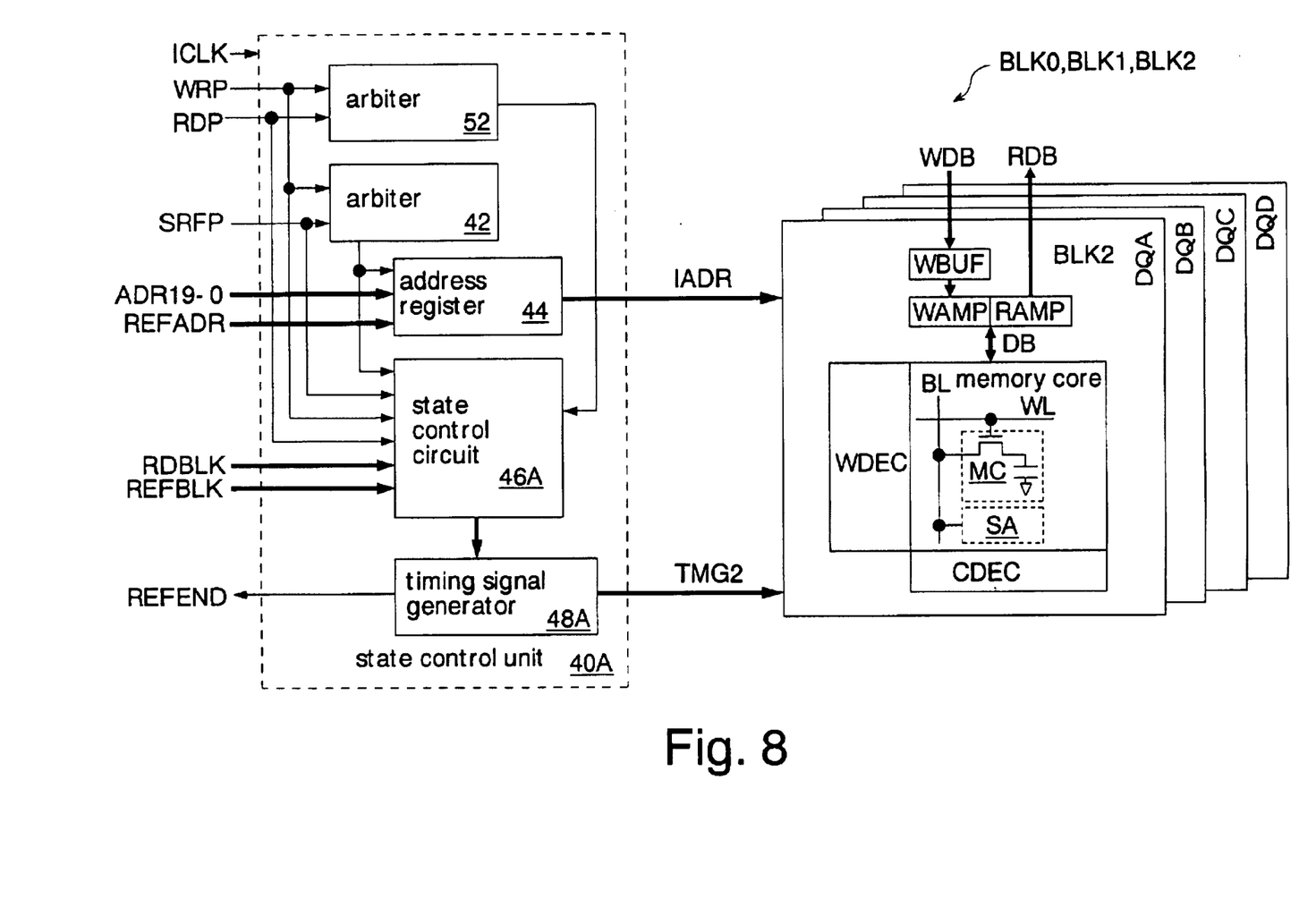
FIG. 8 is a block diagram showing the details of the memory blocks in a third embodiment of the present invention.

FIG. 8 shows the details of the memory blocks in a third embodiment of semiconductor memory according to the present invention. In this embodiment, circuits and signals corresponding to the same circuits and signals in the first embodiment are identified by the same reference designations, and their detailed descriptions are omitted.

The pseudo SRAM of the present embodiment includes state control units 40A of memory blocks BLK0-2 that are different from the state control units 40 of the memory blocks BLK0-2 of the first embodiment. The circuit arrangements of the present embodiment other than the state control units 40A are the same as those of the first embodiment (FIG. 1). According to the present embodiment, the external write cycle time tWC (EXT) is set as 3-clock cycle, while the internal write cycle time tWC (INT) is set as 2.5-clock cycle. Also, the external read cycle time tRC (EXT) (which is equal to the random read cycle time) is set as 1-clock cycle, while the internal read cycle time tRC (INT) is set as 2-clock cycle. The refresh cycle time is set as 2-clock cycle.

In general, when the data opposite to data held in the memory cells MC are written in the write operations, the data read from the memory cells MC must be inverted. For this reason, the write operations require a longer time than the read operations. According to the present embodiment, the write operations have a margin of 0.5 clock as compared with the read operations, so that the design of the timings of the circuits that operate during the write operations can be easy.

The state control units 40A each have an arbiter 52 that decides the priority order between a write signal WRP generated in response to a write command and a read signal RDP generated in response to a read command. The arbiter 52 decides which to be given the priority, the write signal WRP or the read signal RDP, and outputs the decision result to a state control circuit 46A.

The state control circuit 46A of the memory block BLK operating as a read block latches the write signal WRP and holds it until receiving a permission from the arbiter 52. That is, when no write operation can be performed because of the current execution of a read operation, the write signal WRP is held until a completion of the read operation. The other operations of the state control circuits 46A are the same as those of the state control circuits 46 of the first embodiment.

Timing signal generators 48A each outputs, in response to control signals from the associated state control circuit 46A, to the memory units DQA, DQB, DQC, and DQD timing signals TMG2 for performing one of read, write, and refresh operations. The timing signals TMG2 are outputted such that the internal write cycle time tWC (INT), internal read cycle time tRC (INT), and refresh cycle time are 2.5-clock cycle, 2-clock cycle, and 2-clock cycle, respectively.

In a case where the internal write cycle time tWC (INT) is 2.5-clock cycle, the timing of starting a write operation must be in synchronization with any one of the rising and falling edges of a clock signal CLK. Therefore, the timing signal generators 48A output, in synchronization with the rising or falling edge of a clock signal CLK, timing signals TMG2 necessary for write operations.

Figure 9:
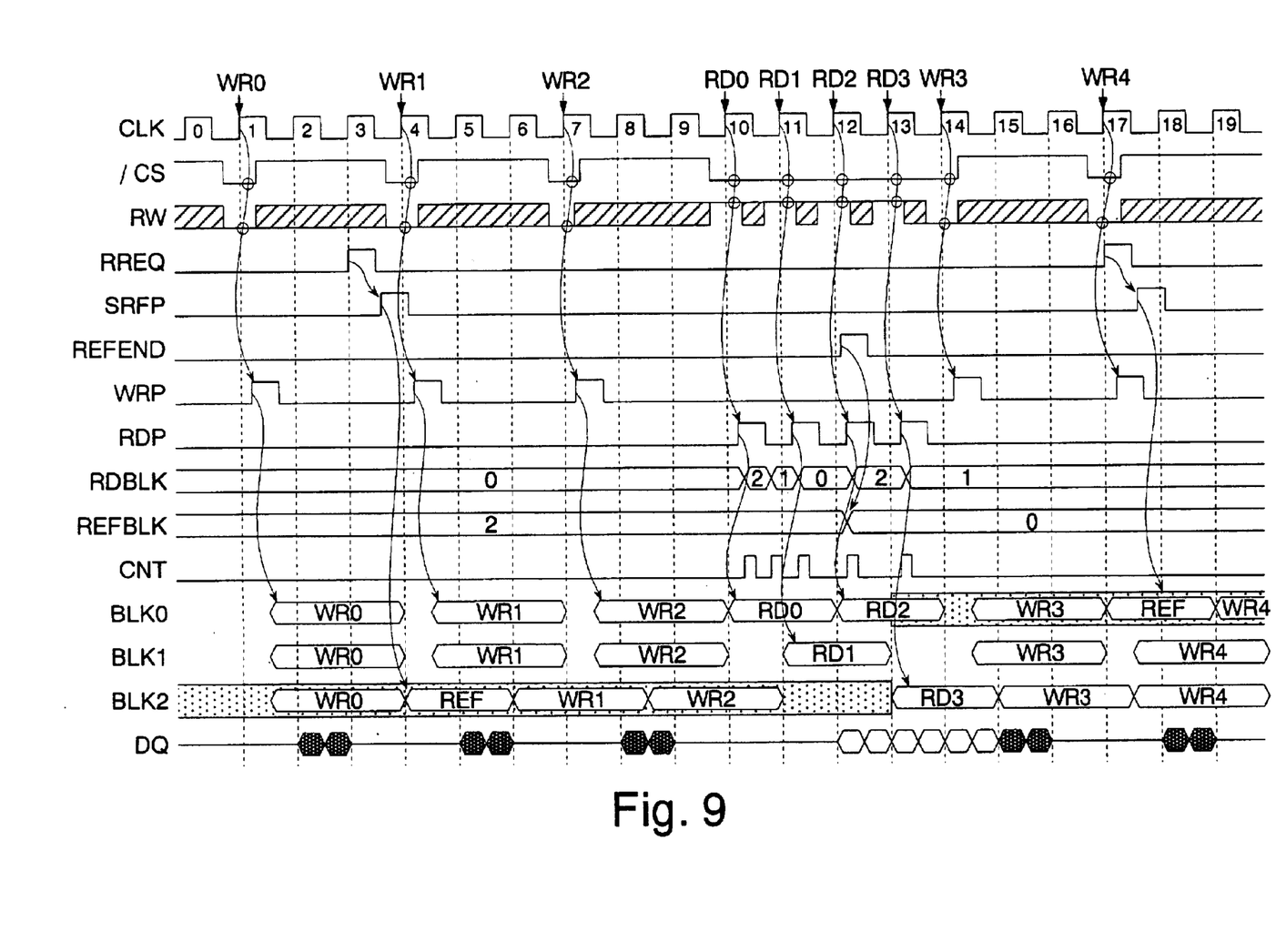
FIG. 9 is a timing diagram showing an example of the operations of the third embodiment.

FIG. 9 shows an example of the operation of the third embodiment.

According to the present embodiment, since the internal write cycle time tWC (INT) is 2.5-clock cycle, a write operation is started 0.5 clock after the supply of a write command WR. Also according to the present embodiment, since the internal write cycle time tWC (INT) is 0.5 clock longer than in the first embodiment, the memory block BLK that performs a refresh operation REF requires a time to compensate for the delay of the write operation. Read operations are performed in synchronization with read commands RD similarly to the first embodiment.

When a write command WR3 is supplied immediately after the supply of a read command RD3, a write operation WR3 of the memory block BLK2 operating as a read block is performed after a completion of a read operation RD3 (after the reception of a permission from the arbiter 52). The write signal WRP corresponding to the write command WR3 is temporarily held in the state control circuit 46A until the write operation WR3 is performed.

The present embodiment can provide similar effects to those of the foregoing first and second embodiments. Additionally, in the present embodiment, the internal write cycle time tWC (INT) was set as 2.5-clock cycle that was 0.5-clock cycle longer than the internal read cycle time tRC (INT). Therefore, the write operations that require the longer time than the read operations can be performed with the margin. As a result, the design of the timings of the circuits that operate during the write operations can be easy.

The foregoing embodiments were described as such examples that one of the three memory blocks BLK0-2 was caused to operate as a refresh block, while the other two memory blocks were caused to alternately perform read operations in the manner that the performed read operations overlapped each other. The present invention, however, is not limited to such embodiments. For example, it may be possible that one of four memory blocks BLK may be caused to operate as a refresh block, while the other three memory blocks BLK may be caused to alternately perform read operations in such a manner that the performed read operations overlap one another. In such a case, causing the three memory blocks BLK to perform such interleaving operations allows the external read cycle time tRC (EXT) to be one third of the internal read cycle time tRC (INT).

The foregoing third embodiment was described as such an example that the refresh cycle time and internal read cycle time tRC (INT) both were set as 2-clock cycles. The present invention, however, is not limited to such an embodiment. For example, the refresh cycle time may be set as 1.5-clock cycle, while the internal read cycle time tRC (INT) may be set as 2-clock cycle.

The invention is not limited to the above embodiments and various modifications may be made without departing from the spirit and scope of the invention. Any improvement may be made in part or all of the components.

What is claimed is:

1. A semiconductor memory comprising:
   a plurality of memory blocks having memory cells, being allocated the same address spaces to write the same data therein, and being operable independently of one another;
   a refresh generator for generating a refresh command to refresh said memory cells;
   a refresh control unit for selecting one of said memory blocks as a refresh block that performs a refresh operation in response to said refresh command; and
   a read control unit for selecting one of said memory blocks other than said refresh block as a read block that performs a read operation in response to a read command, and for selecting, when a new read command is supplied during the read operation performed by said read block, another one of said memory blocks which is in an idle state other than said refresh block as a read block that performs a read operation in response to said new read command.

2. The semiconductor memory according to claim 1, wherein:
   said refresh control unit includes a refresh block counter for performing a count operation in response to said refresh command and for outputting a refresh block signal indicative of said refresh block;
   said read control unit includes a read block counter for performing the count operation in response to said read command and for outputting a read block signal indicative of said read block;
   one of said memory blocks which receives said refresh block signal starts, as said refresh block, the refresh operation in response to said refresh command; and
   another one of said memory blocks which receives said read block signal starts, as said read block, the read operation in response to said read command.

3. The semiconductor memory according to claim 2, wherein
   said read block counter increments or decrements a counter value to differentiate said read and refresh block signals from each other when said read block signal coincides with said refresh block signal by performing the count operation.

4. The semiconductor memory according to claim 3, wherein
   the count direction of said read block counter is opposite to the count direction of said refresh block counter.

5. The semiconductor memory according to claim 1, wherein
   the number of said memory blocks is one more than the maximum number of said read commands that can be supplied during an internal read cycle time necessary for said memory blocks to perform a single read operation.

6. The semiconductor memory according to claim 1, further comprising
   a refresh address counter for generating a refresh address indicative of a memory cell to be refreshed among said memory cells.

7. The semiconductor memory according to claim 1, further comprising
   a write control circuit for performing, in response to a write command, a write operation to write the same data into all of said memory blocks.

8. The semiconductor memory according to claim 7, further comprising
   an arbiter for sequentially performing operations according to said write and refresh commands in the order of accepting the commands when the commands conflict with each other in said refresh block.

9. The semiconductor memory according to claim 8, further comprising
   a clock terminal for receiving a clock signal to synchronize operations of internal circuits, wherein
   said arbiter receives said write command in synchronization with one of rising and falling edges of said clock signal, and receives said refresh command in synchronization with the other one of the rising and falling edges of said clock signal.

10. The semiconductor memory according to claim 7, wherein
    said write control circuit starts the write operation after a completion of said refresh operation in said refresh block when receiving said write command during said refresh operation, and starts the write operation in synchronization with said write command in one or more of said memory blocks other than said refresh block.

11. The semiconductor memory according to claim 10, wherein
    said read operation responsive to said read command supplied during the write operation of said refresh block is performed by one of said memory blocks other than said refresh block.

12. The semiconductor memory according to claim 7, further comprising
    a clock terminal for receiving a clock signal to synchronize operations of internal circuits, wherein
    said write control circuit starts the write operation in said memory blocks one clock after receiving said write command.

13. The semiconductor memory according to claim 7, further comprising
    a clock terminal for receiving a clock signal to synchronize operations of internal circuits, and
    a command receiving circuit for receiving said read and write commands in synchronization with one of rising and falling edges of said clock signal, wherein
        said refresh generator outputs said refresh command in synchronization with the other one of the rising and falling edges of said clock signal.

14. The semiconductor memory according to claim 7, wherein
    the external read cycle time that is the minimum supply interval between two read commands is set as being shorter than the external write cycle time that is the minimum supply interval between two write commands.

15. The semiconductor memory according to claim 7, wherein
    the external write cycle time that is the minimum supply interval between two write commands is set as being longer than the internal write cycle time that is the actual write operation time of said memory blocks.

16. The semiconductor memory according to claim 15, wherein
    one of said refresh operation and n write operations can be performed during a time period of n successive external write cycles.

17. The semiconductor memory according to claim 7, wherein
    one of the internal read cycle time that is the actual read operation time of said memory blocks, the internal write cycle time that is the actual write operation time of said memory blocks, and the refresh cycle time that is the actual refresh operation time of said memory blocks is different from the other cycle times.

18. The semiconductor memory according to claim 7, wherein
    the internal read cycle time that is the actual read operation time of said memory blocks, the internal write cycle time that is the actual write operation time of said memory blocks, and the refresh cycle time that is the actual refresh operation time of said memory blocks are different from one another.

* * * * *